United States Patent [19]

Bauch et al.

[11] 4,346,381

[45] Aug. 24, 1982

[54] BROAD BAND COUPLING ARRANGEMENT

[75] Inventors: Helmut Bauch, Starnberg; Hans Rehm, Munich, both of Fed. Rep. of Germany

[73] Assignee: Siemens Aktiengesellschaft, Berlin & Munich, Fed. Rep. of Germany

[21] Appl. No.: 173,659

[22] Filed: Jul. 29, 1980

[30] Foreign Application Priority Data

Aug. 10, 1979 [DE] Fed. Rep. of Germany ....... 2932587

[51] Int. Cl.$^3$ .................. H04Q 9/00; H03K 19/20
[52] U.S. Cl. .................. 340/825.93; 307/289; 307/291; 179/18 GF; 340/825.86
[58] Field of Search ............ 340/166 R; 333/101; 307/289, 291, 455, 567; 179/18 GF

[56] References Cited

U.S. PATENT DOCUMENTS

| | | | |
|---|---|---|---|
| 3,550,087 | 12/1970 | Ross et al. | 340/166 R |
| 3,953,746 | 4/1976 | Fett | 307/291 |
| 4,237,387 | 12/1980 | Devendorf et al. | 307/289 |
| 4,276,485 | 6/1981 | Rydval | 307/291 |

OTHER PUBLICATIONS

Pfannschmidt "Limitation of Transmission Rate in High-Speed TDM-Switching Networks Using Schottky-TTL Circuit Technology", Proceedings 1976 International Zürich Seminar of Digital Communications, pp. C3.1-C3.6.

Primary Examiner—Donald J. Yusko
Attorney, Agent, or Firm—Hill, Van Santen, Steadman, Chiara & Simpson

[57] ABSTRACT

The disclosure relates to coupling point switches in ECL technology. The coupling point switches are each formed by means of a differential amplifier circuit with two emitter-coupled high frequency transistors; in order to reduce the power consumption, a switching transistor is inserted in the common emitter current circuit, the switching transistor only being conductive when the appertaining coupling point is driven into the through-connected condition. The disclosure can particularly be employed in the distribution of video signals.

6 Claims, 2 Drawing Figures

BROAD BAND COUPLING ARRANGEMENT

BACKGROUND OF THE INVENTION

The invention relates to a coupling arrangement for selective through-connection of signals of high band width which, in particular, can be employed in the distribution of video signals.

In such a broad band coupling arrangement, the coupling point circuits, whose function is to selectively connect input lines to output lines of the coupling arrangement, can be formed by means of logic linkage elements realized in ECL (emitter coupled logic) technology in view of the required switching times which are to be as small as possible or, respectively, in view of the preferably frequency-, pulsphase- or pulscode-modulated signals to be through-connected with signal frequencies of, for example, up to more than 80 MHz (cf. Pfannschmidt: "Arbeitsgeschwindigkeitsgrenzen von Koppelnetzwerken für Breitband-Digitalsignale", Dissertation, Technical University, Braunschweig, 1978; and German AS No. 28 28 662). Independent of their respective switching state, however, such commercially available linkage elements cause dissipations, so that larger coupling fields exhibit a relatively high, largely useless power consumption (cf., also, Harthmuth, Duck, Jenik: "Aufbau und Anwendung integrierter Halbleiterschaltungen", Regelungstechnik 16 (1968) 12, 541...588, and 17 (1969) 1, 12...18; Section 3c).

SUMMARY OF THE INVENTION

The object of the invention is to avoid such an unnecessary power consumption. The invention relates to a broad band coupling arrangement with coupling point circuits in ECL technology. This coupling arrangement is inventively characterized in that the coupling point switches are exclusively constructed of transistors which are only conductive in the conductive state of the respective coupling point switch.

In addition to the advantages of a considerable power reduction and, thus, lower operating costs as well as lower demands made of the power supply devices, the invention is accompanied by a series of further advantages: Thus, the low dissipation heat allows the compact format, whereby cooling measures can be completely omitted or at least significantly reduced; in the integration, under certain conditions, a correspondingly great plurality of components can be combined on one module (chip). In a large coupling arrangement, in which the plurality of the coupling point switches respectively through-connected is small in comparison to the overall number of coupling point switches, the coupling point switches have a correspondingly low mean operating time and, thus, a correspondingly long service life or, respectively, a correspondingly reduced failure rate; since the currentless coupling point circuits respectively situated in the blocking state effect no signal amplification, a greater cross-talk attenuation is achieved in the coupling arrangement at the same time and lower noise is obtained.

Let it be pointed out here that it is known (for example, from the German OS No. 1,499,328) to provide a transistor in the emitter current branch of two emitter-coupled further transistors in a circuit arrangement for generating an electrical output signal proportional to the product of two input signals; problems of a selective through-connection of broad band signals through a coupling arrangement and of the power consumption of such a broad band coupling arrangement, however, are thereby not touched upon.

In a further development of the invention, the coupling point switches can be respectively formed by a differential amplifier circuit with two emitter-coupled HF (high frequency) transistors and a switching transistor inserted in the common emitter current branch which is conductive only given selection of the appertaining coupling point switch, whereby one of the HF transistors is connected with its base to an input line of the coupling arrangement and an output line of the coupling arrangement is connected to the collector of one of the HF transistors; thereby, the one HF transistor can be connected with its base to the respective input line and with its collector to a reference potential source (ground), whereas the respective output line is connected to the collector of the other HF transistor whose base lies at a potential tapped from an operating voltage divider. Upon employment of correspondingly rapid HF transistors, such a coupling arrangement in which a coupling point switch (including load) can exhibit a power consumption of approximately 40 through 50 mW in the conductive state and a power consumption which practically approaches zero in the blocking state is suitable for the through-connection of signals of up to more than 600 Mbit/s.

In a further development, the base electrodes of the said respective one HF transistors of an entire row of differential amplifier circuits can be, on the one hand, connected to the appertaining input line and multiply connected with one another in order to thus render possible a selective through-connection of the appertaining input line to one of a plurality of output lines; on the other hand, the collectors of the respectively other HF transistors of an entire column of differential amplifier circuits can be connected to the appertaining output line and multiply connected with one another in order to render possible a selective through-connection of one of a plurality of input lines to this output line.

In a further development of the invention, the one main electrodes of the switching transistors of a column of differential amplifier circuits can be connected to an operating potential source and multiply connected with one another, in which column of differential amplifier circuits the collectors of the one HF transistors are connected to the appertaining output line multiply connected amongst one another. In a further development, the control electrodes of the switching transistors can be connected to the individual outputs of a selection decoder allocated to the coupling arrangement.

The invention will be described in yet greater detail on the basis of the accompanying drawing sheet; and other objects, features and advantages will be apparent from this detailed disclosure and from the appended claims.

DETAILED DESCRIPTION

Figure 1:
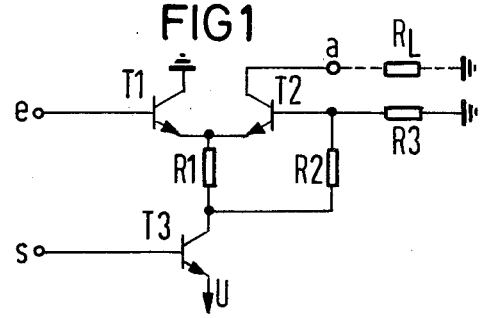
FIG. 1 shows an exemplary embodiment for a coupling point switch according to the invention.

FIG. 1 of the drawing shows a broad band coupling arrangement with a coupling point switch in ECL technology which is essentially formed from a differential amplifier circuit with two emitter-coupled HF transistors T1, T2 and a switching transistor T3 inserted together with a resistor R1 in the common emitter current circuit, the main electrode of said switching transistor T3 which is remote from the HF transistors being connected with and at the potential of an operating voltage source U (exhibiting an operating voltage of, for example, −5 V). The one HF transistor T1 is connected with its base to an input line e of the coupling arrangement and has its collector connected with and at the potential of a reference potential source (ground); an output line a of the coupling arrangement is connected to the collector of the other HF transistor T2 whose base lies at a potential tapped from an operating voltage divider with configuration (with the switching transistor T3 in conducting state) of ground /R3/R2/U; also it is indicated in FIG. 1 of the drawing that this output line a can be loaded with a load resistor $R_L$. The switching transistor T3 lies with its base at the selection line s of the coupling point switch, so that it is only conductive when the latter is selected.

Given such a selection via the selection line s, which can occur with TTL signal level, the coupling point switch illustrated in FIG. 1 is situated in the conductive condition and thus offers a rapid signal path between the input line e and the output line a via which signals up to more than 600 Mbit/s can be through-connected, at least given discrete construction with correspondingly rapid HF transistors T1 and T2; thereby, it is advantageous that the selection circuit itself need not be designed for such high frequency or, respectively, broad band signals since it need not follow such signals since it only effects the through-connection of the coupling point switch in the completion of a connection between input line e and output line a and the blockage of the coupling point switch when the connection is released and only conducts a practically constant sum current of both HF transistors T1, T2 during the through-connected condition. The power consumption of the coupling point switch in the through-connected condition lies at approximately 40 ... 50 mW.

When the coupling point switch is not selected, the switching transistor T3 and, thus,—due to the nonconduction of the operating voltage U of, for example, −5 V—the HF transistors T1, T2 are also nonconductive. Thus, the coupling point switch is situated in the blocking condition; the power consumption practically approaches zero milliwatt (0 mW).

Figure 2:
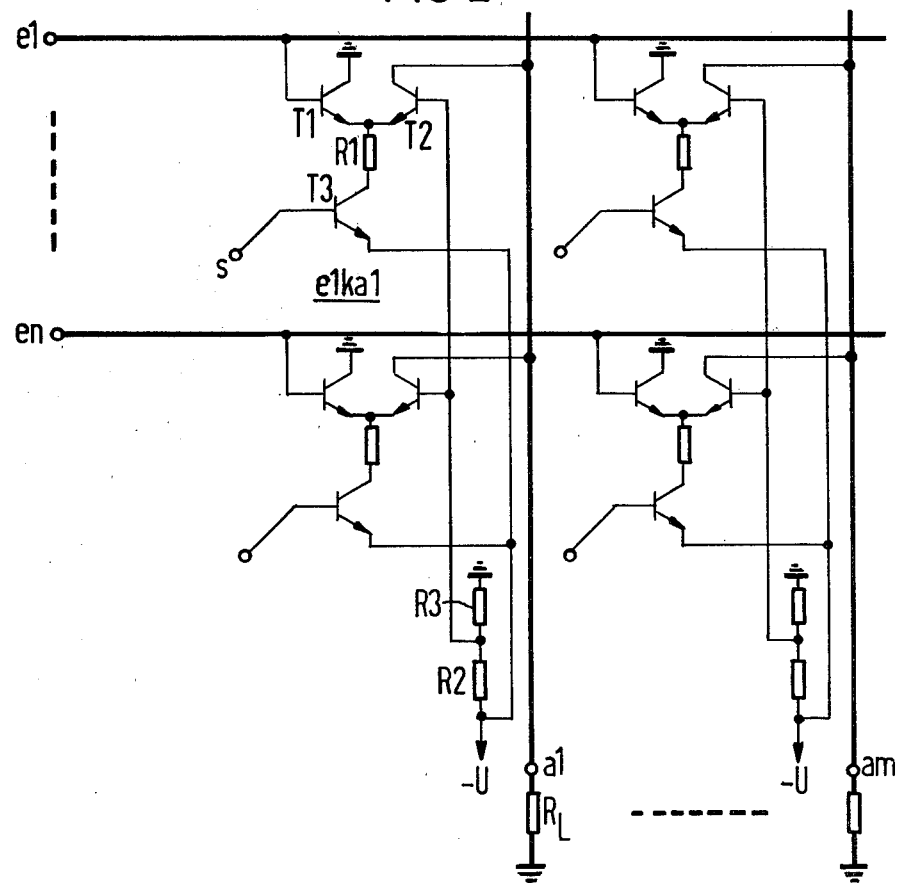
FIG. 2 shows a coupling matrix constructed with coupling point switches according to FIG. 1.

In a scope necessary for understanding the invention, FIG. 2 of the drawing shows a broad band coupling matrix constructed with coupling point switches according to FIG. 1 and with a plurality of input lines e1 ... en and a plurality of output lines a1 ... am. A coupling point switch lies in the point of intersection of a respective input line and an output line; thus, the coupling point switch e1ka1 lies in the point of intersection of the input line e1 and the output line a1.

This coupling point switch is fundamentally constructed in the manner to be seen from FIG. 1, and thus in turn contains a differential amplifier circuit with two emitter-coupled HF transistors T1, T2 and a switching transistor T3 lying in series to the common emitter resistor R1 which is only conductive given selection of the appertaining coupling point switch (e1ka1), the base of said switching transistor T3 being connected for the purpose of selective activation to the selection line s of the coupling point switch e1ka1. Each of the coupling point switches of the broad band coupling matrix according to FIG. 2 exhibits such a selection line individually allocated to it, as is indicated with s in the coupling point switch e1ka1; these selection lines and, thus, the control electrodes of the individual switching transistors such as T3 can be connected to the respective individual outputs of a selection decoder allocated to the coupling matrix, without this being additionally illustrated in detail in FIG. 2.

Thereby, the base electrodes of the respectively one HF transistors, such as the HF transistor T1 of the coupling point switch e1ka1, of an entire row of differential amplifier circuits are connected to the input line e1 of the coupling arrangement according to FIG. 2, being multiply connected amongst one another; the same is true of the further input lines ... en of the broad band coupling arrangement according to FIG. 2. On the other hand, the collectors of the respectively other HF transistors, such as the HF transistor T2 of the coupling point switch e1ka1, of an entire column of differential amplifier circuits are connected to the output line a1, being multiply connected amongst one another. The maximum plurality n of the coupling point switches whose outputs can thus be connected to a common output line by means of "wired-or" linkage depends on the HF transistor properties as well as the height or magnitude of the frequencies of the signals to be transmitted. Thus, upon employment of, for example, discrete HF transistors given by means of transistors BFS20, signals with signal frequencies up to the magnitude of 100 MHz can be through-connected via a broad band coupling arrangement according to FIG. 2 exhibiting approximately n=20 input lines. However, let it be particularly emphasized in this context that the invention is not limited to a realization of the broad band coupling arrangement with discrete components but, rather, is also specifically intended for a monolithically integrated solution.

When a coupling point switch, for example the coupling point switch e1ka1, is selected via the selection line s individually allocated to it, then the switching transistor T3 of the coupling point switch becomes conductive, so that the operating potential U of, for example, −5 V, is connected to the emitter branch of the two HF transistors T1, T2 of the coupling point switch e1ka1. To that end, it is indicated in FIG. 2 that the emitters of the switching transistors (T3) of a column of coupling point switches (e1ka1) are connected to an operating potential source U and multiply connected with one another, from which operating potential source U the control potential for the respective second HF transistor (T2) is tapped at the same time via a voltage divider R2, R3. The two HF transistors T1, T2 of the appertaining coupling point switch e1ka1 can, thus, arrive in the conductive condition, wherewith the appertaining coupling point switch is situated in the through-connected condition in which it offers a rapid signal path between the appertaining input line (e1) and the appertaining output line (a1). In this case, the selection circuit itself e.g. including transistor T3 can again be laid out for significantly slower signals since it carries only the practically constant sum current of the two HF transistors T1, T2 during the through-connected condition of the coupling point switch e1ka1.

The selection of a coupling point switch such as, for example, e1ka1, leaves the nonselected coupling point switches of the broad band coupling arrangement according to FIG. 2 without influence, regardless of whether or not these coupling point switches lie at the same input line (e1) or output line (a1) of the coupling point switch e1ka1 just considered; insofar as such coupling point switches are not themselves selected via their individual selection line, their transistors T1, T2, T3 are currentless and, thus, the coupling point switches are practically dissipation free.

It will be apparent that many modifications and variations may be effected without departing from the scope of the novel concepts and teachings of the present invention.

We claim as our invention:

1. A broad band coupling arrangement comprising a matrix of cross point circuits in ECL technology, said coupling point circuits being formed of cross point switches (e1ka) constructed only with transistors (T1, T2, T3) which are conductive only in the through-connected condition of the respective cross point switch, said matrix having an input line (e) and an output line (a), the cross point switches being respectively formed by a differential amplifier circuit with two emitter-coupled transistors (T1, T2) having a common emitter current branch, having base electrodes and having collector electrodes, and a switching transistor (T3) having main electrodes coupled with the common emitter current branch which switching transistor is conductive only upon selection of the appertaining cross point switch, one of the emitter-coupled transistors (T1) of each cross point switch having its base electrode connected to the input line (e) of the matrix, and the output line (a) of the matrix being connected to the collector electrode of one of the emitter-coupled transistors (T2), said matrix having rows and columns of the differential amplifier circuits, the base electrodes of one of the emitter-coupled transistors (T1) of a row of differential amplifier circuits being connected in common with the input line (e), and being multiply connected with one another, the collectors of one of the emitter coupled transistors (T2) of a column of differential amplifier circuits being connected in common with the output line (a), characterized in that the collectors of the ones of the emitter coupled transistors (T2) which are connected in common to the output line (a) of the matrix are respectively multiply connected with one another via a signal path free of inverse feedback.

2. A broad band coupling arrangement according to claim 1, with the base electrodes of first transistors (T1) of said emitter coupled transistors being connected in common with the input line (e) and the collectors of second transistors (T2) of said emitter coupled transistors being connected in common with the output line (a), the collectors of said second transistors (T2) of said column of differential amplifier circuits being connected in common with the output line (a).

3. A broad band coupling arrangement according to claim 2, having an operating voltage divider (R2, R3) with an output, characterized in that the first transistor (T1) is connected with its base to the input line (e) and is connected with its collector to a reference potential source (ground) and the output line (a) is connected to the collector of the second transistor (T2), the base of said second transistor (T2) being connected with the output of said operating voltage divider (R2, R3).

4. A broad band coupling arrangement according to claim 1, with the switching transistors (T3) of a matrix column having one main electrode connected to an operating voltage source.

5. A broad band coupling arrangement according to claim 9, with the switching transistors (T3) of a matrix column having one main electrode connected to an operating voltage source.

6. A broad band coupling arrangement according to claim 3, with the switching transistors (T3) of a matrix column having one main electrode connected to an operating voltage source.

* * * * *